(12) United States Patent
Syroiezhin et al.

(10) Patent No.: US 12,301,218 B2
(45) Date of Patent: *May 13, 2025

(54) RF SWITCH WITH SWITCHING TIME ACCELERATION

(71) Applicant: Infineon Technologies AG, Neubiberg (DE)

(72) Inventors: Semen Syroiezhin, Erlangen (DE); Valentyn Solomko, Munich (DE); Matthias Voelkel, Unterhaching (DE); Aleksey Zolotarevskyi, Erlangen (DE)

(73) Assignee: Infineon Technologies AG, Neubiberg (DE)

( * ) Notice: Subject to any disclaimer, the term of this patent is extended or adjusted under 35 U.S.C. 154(b) by 142 days.

This patent is subject to a terminal disclaimer.

(21) Appl. No.: 18/325,875

(22) Filed: May 30, 2023

(65) Prior Publication Data

US 2023/0308085 A1 Sep. 28, 2023

Related U.S. Application Data

(63) Continuation of application No. 17/648,849, filed on Jan. 25, 2022, now Pat. No. 11,728,800.

(51) Int. Cl.
| | |
|---|---|
| *H03K 17/04* | (2006.01) |
| *H03K 17/0412* | (2006.01) |
| *H03K 17/042* | (2006.01) |
| *H03K 17/16* | (2006.01) |
| *H03K 17/687* | (2006.01) |
| *H03K 17/693* | (2006.01) |

(52) U.S. Cl.
CPC . *H03K 17/04206* (2013.01); *H03K 17/04123* (2013.01); *H03K 17/687* (2013.01); *H03K 2217/0054* (2013.01)

(58) Field of Classification Search
None
See application file for complete search history.

(56) References Cited

U.S. PATENT DOCUMENTS

| | | | |
|---|---|---|---|
| 7,868,683 | B2 | 1/2011 | Ilkov |
| 9,893,722 | B2 | 2/2018 | Mokalla |
| 9,917,575 | B2 | 3/2018 | Solomko et al. |
| 10,044,349 | B2 | 8/2018 | Scott et al. |
| 10,804,892 | B2 | 10/2020 | Dribinsky et al. |
| 10,848,141 | B2 | 11/2020 | Shanjani et al. |
| 10,897,246 | B2 | 1/2021 | Scott et al. |
| 11,728,800 | B1 * | 8/2023 | Syroiezhin ........... H03K 17/102 327/427 |
| 2017/0201245 | A1 | 7/2017 | Scott et al. |

FOREIGN PATENT DOCUMENTS

EP  3484049 B1  8/2021

* cited by examiner

*Primary Examiner* — Kenneth B Wells
(74) *Attorney, Agent, or Firm* — Slater Matsil, LLP

(57) ABSTRACT

A radio frequency (RF) switch includes a switchable RF path including a plurality of transistors coupled in series; a gate bias network including a plurality of resistors, wherein the gate bias network is coupled to each of the plurality of transistors in the switchable RF path; and a bypass network including a first plurality of transistors coupled in parallel to each of the plurality of transistors in the switchable RF path and a second plurality of transistors coupled in parallel to each of the plurality of resistors in the gate bias network.

20 Claims, 10 Drawing Sheets

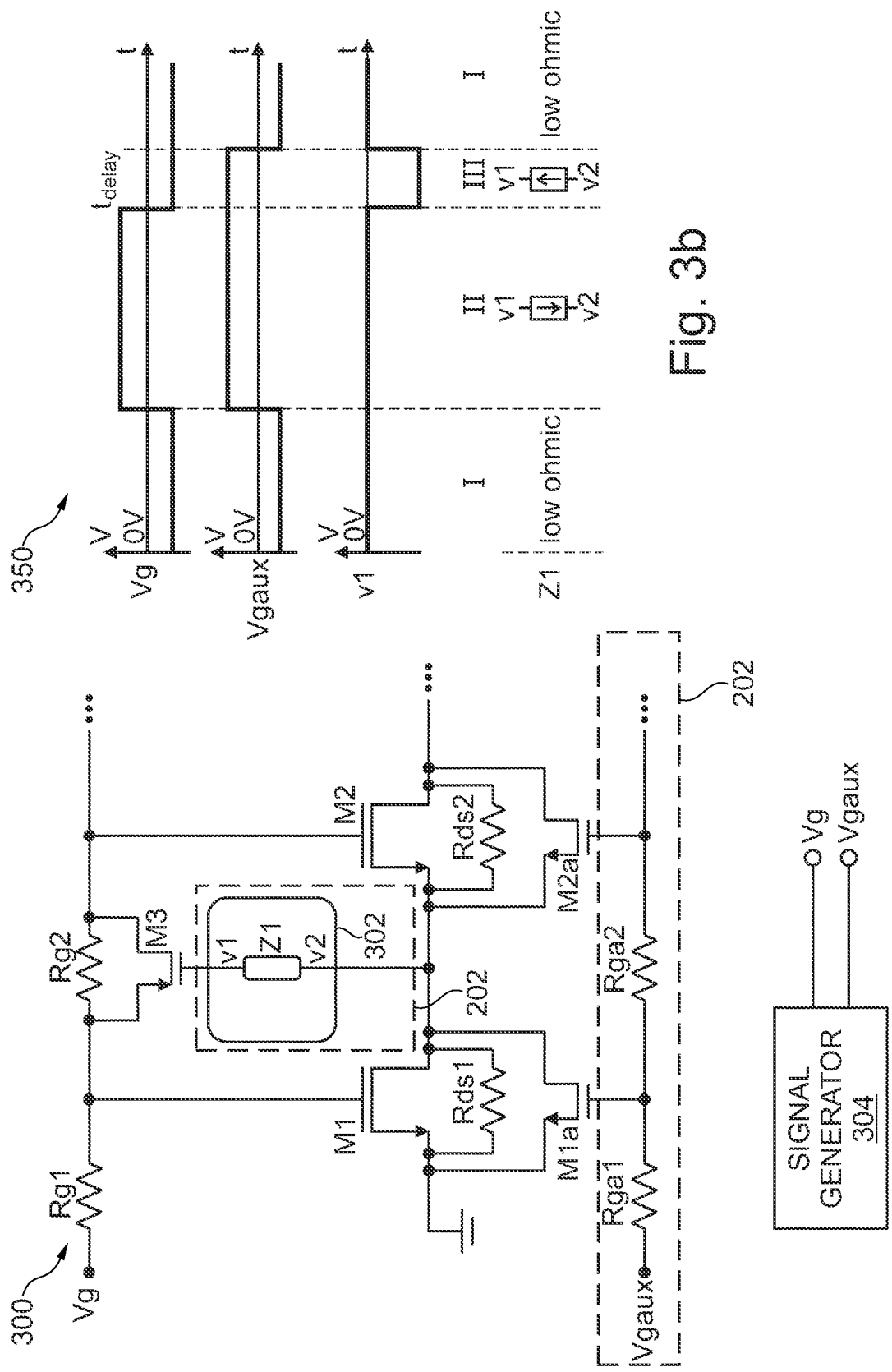

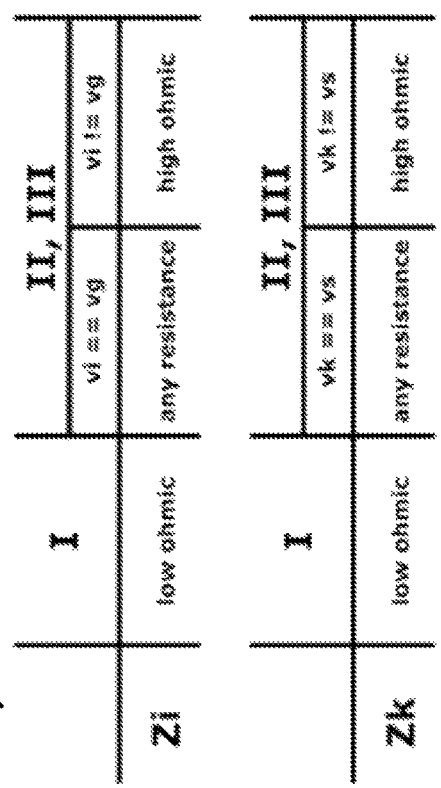
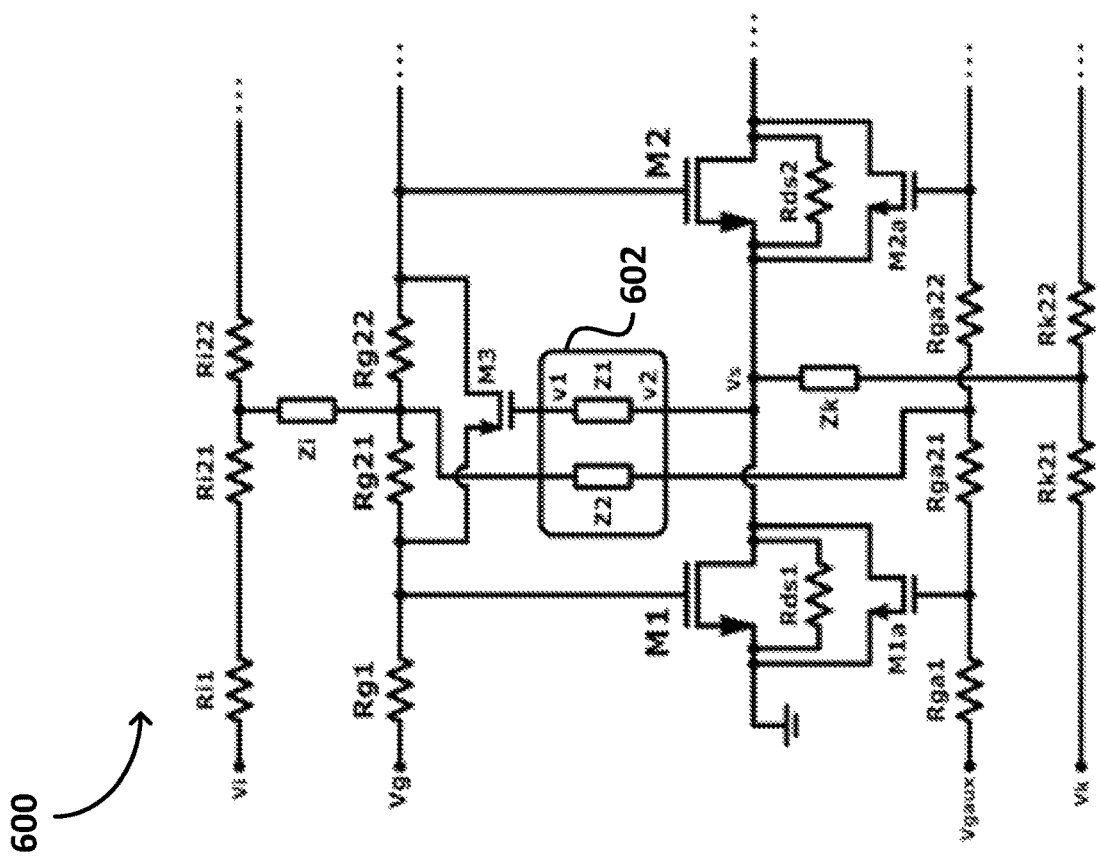
Fig. 6b
Fig. 6a

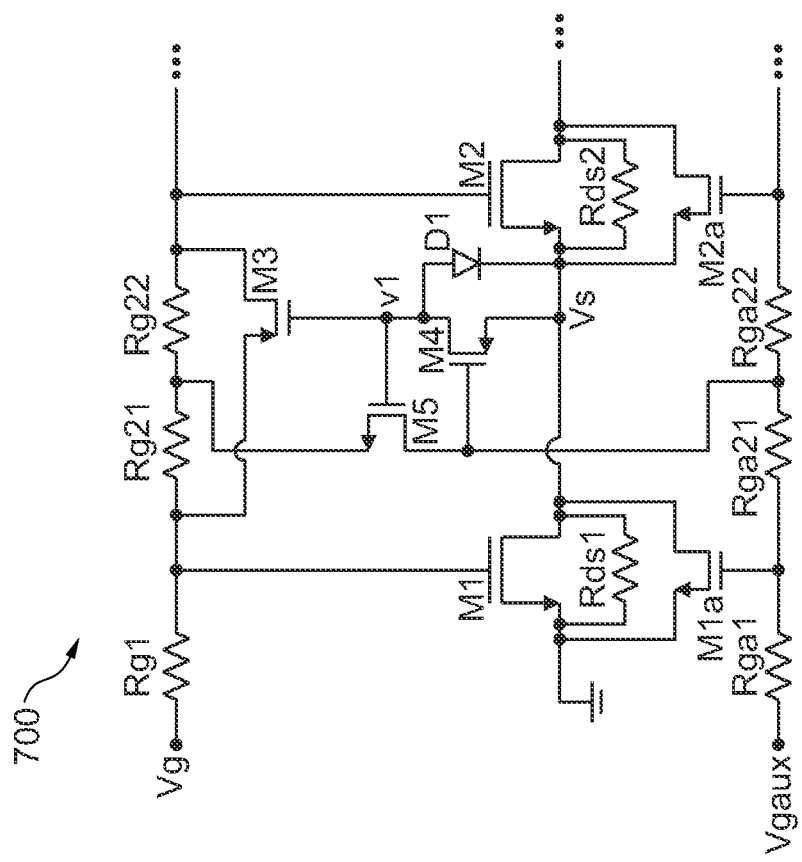
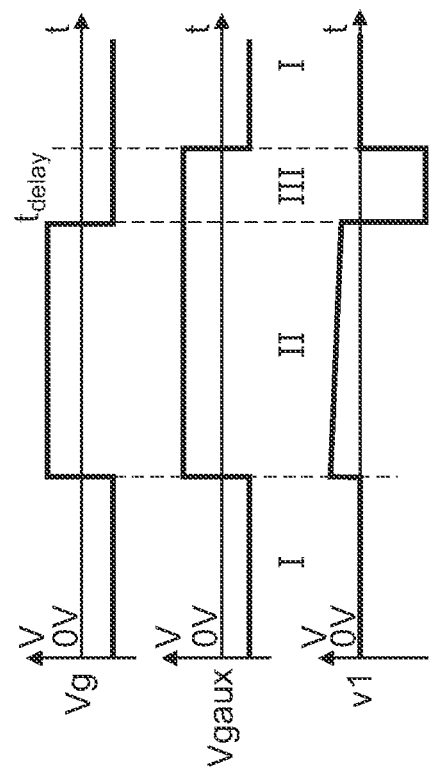
Fig. 7a
Fig. 7b

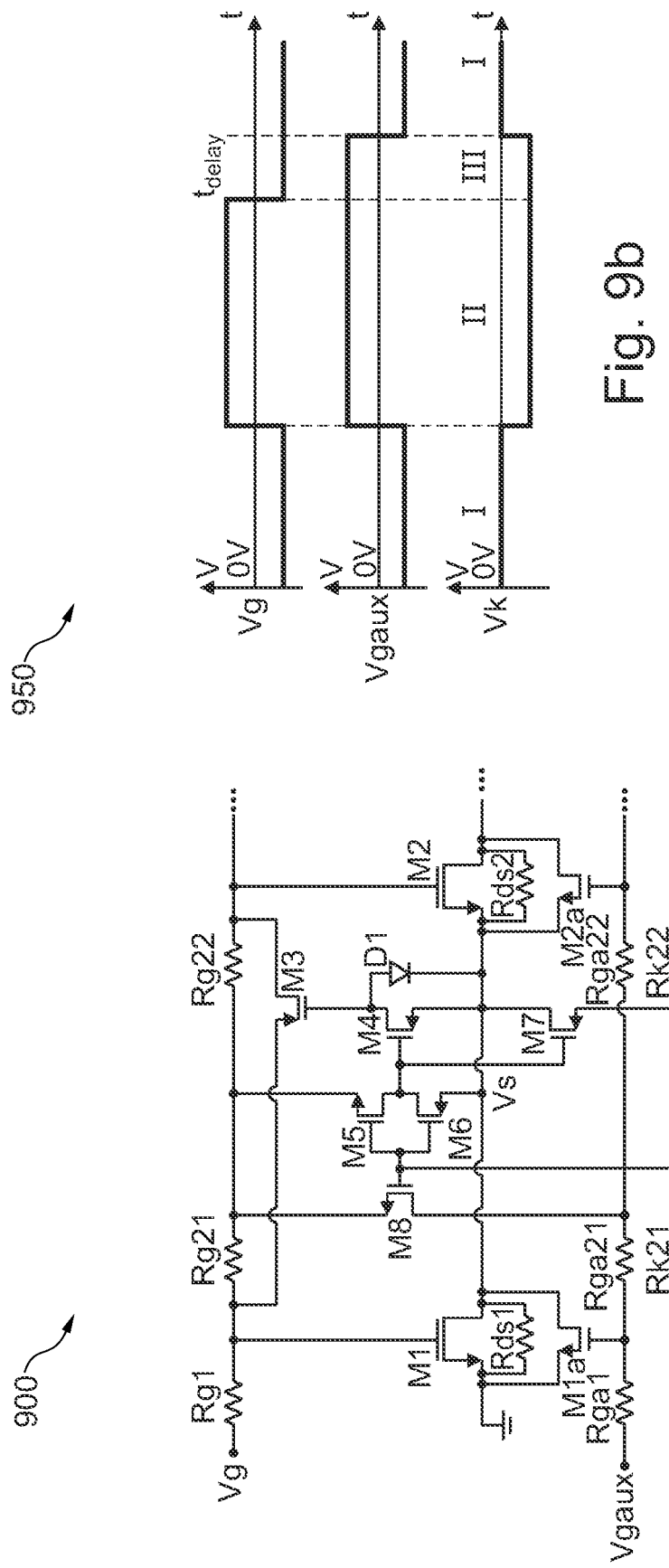

RF SWITCH WITH SWITCHING TIME ACCELERATION

CROSS-REFERENCE TO RELATED APPLICATIONS

This application is a continuation application of U.S. patent application Ser. No. 17/648,849, filed on Jan. 25, 2022, now U.S. Pat. No. 11,728,800, which application is hereby incorporated by reference in its entirety.

TECHNICAL FIELD

The present invention relates generally to a Radio Frequency (RF) switch with switching time acceleration, and, in particular embodiments, to a corresponding system and method.

BACKGROUND

Antenna tuning switches are used in cell phones to adjust the properties of the antenna. The switches are implemented as series stacked MOS transistors. A series connection is used to achieve high voltage handling at RF frequencies that are generated at the antenna. The switch is connected between the feed of an antenna and front-end electronics or coupled between the integrated antenna and the system ground plane.

An important parameter of the switchable element is the switching time, which defines what time it takes for the switch to become fully opened or fully closed. The switching time determines when the RF signal can be applied to the antenna.

SUMMARY

According to an embodiment, a radio frequency (RF) switch includes a switchable RF path including a plurality of transistors coupled in series; a gate bias network including a plurality of resistors, wherein the gate bias network is coupled to each of the plurality of transistors in the switchable RF path; and a bypass network including a first plurality of transistors coupled in parallel to each of the plurality of transistors in the switchable RF path and a second plurality of transistors coupled in parallel to each of the plurality of resistors in the gate bias network.

According to an embodiment, a radio frequency (RF) switch cell includes a first transistor having a control path and a control node; a first biasing resistor coupled to the control node of the first transistor, wherein the first biasing resistor is configured for receiving a first control signal; a second transistor in parallel with the control path of the second transistor; a second biasing resistor coupled to the control node of the second transistor, wherein the second biasing resistor is configured for receiving a second control signal; a third transistor having a control path coupled across the first biasing resistor; and a first variable resistor coupled between a control of the third transistor and the control path of the first transistor.

According to an embodiment, a method of operating a radio frequency (RF) switch includes adjusting an resistor-capacitor (RC) constant of a gate of a switch transistor of the RF switch to a low value during a switching transient of the RF switch; and adjusting the RC constant of the gate of the switch transistor to a high value during an OFF mode of operation of the RF switch, wherein adjusting the RC constant of the gate of the switch transistor to a low value includes shorting a gate bias resistor coupled to the switch transistor and shorting a current path of the switch transistor during the switching transient.

BRIEF DESCRIPTION OF THE DRAWINGS

For a more complete understanding of the present invention, and the advantages thereof, reference is now made to the following descriptions taken in conjunction with the accompanying drawings, in which:

FIG. 3a is a more detailed schematic diagram of the RF switch of FIG. 2, including a first variable resistor, according to an embodiment;

FIG. 3b is a timing diagram associated with the schematic diagram of FIG. 3a;

FIG. 4b is a timing diagram associated with the schematic diagram of FIG. 4a;

FIG. 6a is a more detailed schematic diagram of the RF switch of FIG. 2, including first and second control branches, according to an embodiment;

FIG. 6b is a timing diagram associated with the schematic diagram of FIG. 6a;

FIG. 7a is a more detailed schematic diagram of the RF switch of FIG. 2, wherein the first and second variable resistors are implemented as portions of an NMOS/PMOS variable resistor circuit, according to an embodiment;

FIG. 7b is a timing diagram associated with the schematic diagram of FIG. 7a;

FIG. 8b is a timing diagram associated with the schematic diagram of FIG. 8a;

FIG. 9a is a more detailed schematic diagram of the RF switch of FIG. 2, wherein the first and second variable resistors are implemented as portions of an NMOS/PMOS variable resistor circuit coupled to a first control branch, according to an embodiment;

FIG. 9b is a timing diagram associated with the schematic diagram of FIG. 9a;

DETAILED DESCRIPTION OF ILLUSTRATIVE EMBODIMENTS

Figures 1, 2:
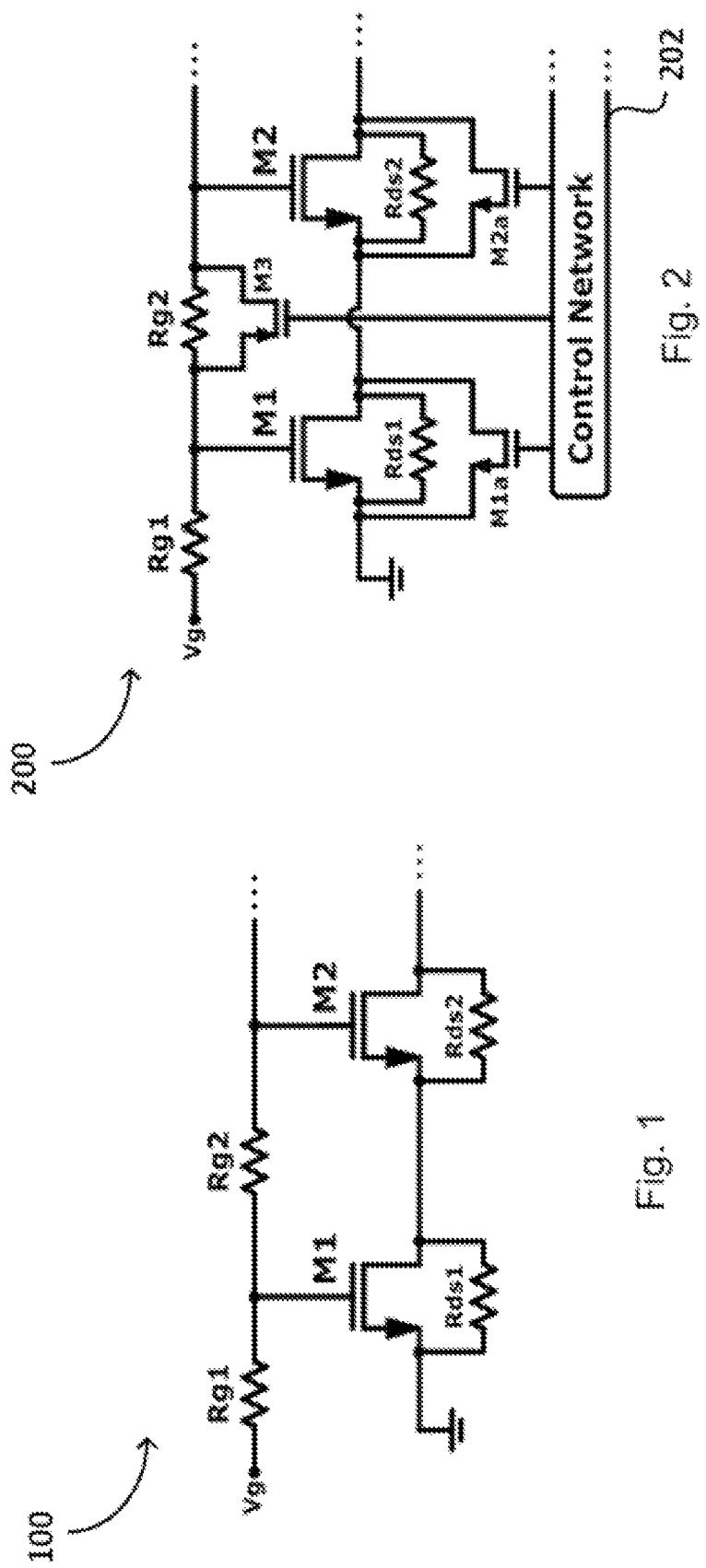
FIG. 1 is a schematic diagram of an exemplary RF switch.
FIG. 2 is a schematic diagram of an RF switch according to an embodiment.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown byway of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

Cellular networks have been undergoing significant changes in the process of meeting ever increasing demands on data rate and quality of service. Evolving cellular network standards therefore have higher channel bandwidths than previous standards. Thus, there is a corresponding need for switching time reduction of antenna tuning switchable elements (RF switches) based on MOS transistors. Switching time reduction is also needed due to an increasing number of frequency bands and a desire for fine tuning capabilities.

Resistors and parasitic capacitances (RC network) associated with the MOS transistors of the RF switch can determine a maximum switching speed. The RC network comprises a resistor in series with the gate terminal of each MOS transistors in an RF switch cell and the associated gate-source/gate-drain parasitic capacitances. It is difficult to reduce the RC time constant of the RC networks because:

The gate-source/gate-drain capacitance is typically a high value to keep the drains/sources of the cell transistors well defined when an RF signal is applied and the switch is opened (i.e., the RF switch is operating in an OFF-state).

Gate resistors coupled in series between a source of DC voltage and ground, in some stacked embodiments described in further detail below, define the DC voltage of the gate terminal of the MOS transistors in the RF switch. These resistors are typically a high value to keep the gate impedance of the cell transistor high. High impedance minimizes the influence of the DC biasing voltages on the gate voltage at high frequencies when RF signal is present and the switch is opened.

Power losses in the RF switch are inversely proportional to the resistance of the bias resistors of the circuit. Therefore, there is a tradeoff between switching speed and RF performance of the RF switch. It is desirable, therefore, to quickly recharge the gate capacitances (gate-source capacitance and gate-drain capacitance) of the RF switch without decreasing the RC time constant in the high ohmic state of the switch. The tradeoff is especially strong in high-stacked (multiplicity of stacked transistors) antenna tuning switches, where the RC time constant cannot be easily reduced without severe degradation of power losses and substantial distortion of voltage division inside the MOSFET stack of the RF switch.

RF switch embodiments described below address aspects of the above-described performance tradeoff by adjusting the RC constant to a low value during portions of the switching process and then reversing the RC time constant back to the high value during normal RF operation. The RC time control is achieved by bypassing the gate bias resistor using a PMOS transistor operating in an ON state during a switching transient, in an embodiment. The ON state operation is extended by conserving the gate charge (which sustains the conductive channel for the PMOS transistor) for a short time after the arrival of "state-change" command (for example a signal for turning the RF switch from ON to OFF), followed by the clamping of the PMOS transistor gate terminal to the respective node in the stack after completion of the switching transient. Conserving the gate charge for a short time is described in detail below, particularly with respect to the timing diagram of FIG. 3b, during time interval III. The "respective node" is referred to as a node in the switchable RF path having the same of similar RF potential at the as the gate bias resistor shorted by said PMOS device. Other features of embodiment RF switches are described in further detail below.

The topology of a section of an exemplary RF switch 100 is shown in FIG. 1. RF switch 100 comprises transistors M1 and M2, gate resistors Rg1 and Rg2, drain-source resistors Rds1 and Rds2, and a gate control voltage Vg. When Vg is high, RF switch 100 is in a low ohmic state; when Vg is low, RF switch 100 is in a high ohmic state (isolation state). The gate resistors Rg1 and Rg2 are used to set the operating point of the switches when an RF signal is applied.

FIG. 2 is a schematic diagram of an RF switch 200 according to an embodiment. With respect to RF switch 100 shown in FIG. 1, RF switch 200 adds three devices (M1a, M2a, and M3) to each pair of the series-connected RF transistors M1 and M2, as well as a control network 202 coupled to the gates of transistors M1a, M2a, and M3 as is shown in FIG. 2. The drain of NMOS transistor M1a is coupled to the drain of switching transistor M1, and the source of NMOS transistor M1a is coupled to the source of switching transistor M1. Similarly, the drain of NMOS transistor M2a is coupled to the drain of switching transistor M2, and the source of NMOS transistor M2a is coupled to the source of switching transistor M2. The source and drain of PMOS transistor M3 is coupled across gate resistor Rg2 and to the gates of the switching transistors M1 and M2, respectively.

The purpose of transistors M1a, M2a, and M3 is to change the RC constants associated with RF switch transistors M1 and M2 during a switching transient from a high value to a low value in order to improve the switching speed of the RF switch, and thereafter restore the RC constants to the high value before the switching transient. In operation, control network 202 controls the gate terminals of the devices M1a, M2a, and M3 and is described in greater detail below. While two switching transistors M1 and M2, two gate resistors Rg1 and Rg2, and three acceleration transistors M1a, M2a, and M3 are shown in FIG. 2, it will be appreciated by those skilled in the art that additional switching transistors, gate resistors, and acceleration transistors can be used in other embodiments. In other words, while only two RF switching cells are shown in FIG. 2, other additional switching cells can be used in other RF switch embodiments.

FIG. 3a is a more detailed schematic diagram of the RF switch of FIG. 2, according to an embodiment. RF switch includes all of the components previously described, but includes further details of the control network 202. For example, control network 202 is shown to include a first resistor Z1, which can be a variable resistor in an embodiment. The first resistor Z1 can be implemented by a variable resistor circuit 302 that will be described in further detail below. A first terminal of resistor Z1 (with a corresponding voltage of V1) is coupled to the gate of transistor M3. A second terminal of resistor Z1 (with a corresponding voltage of V2) is coupled to the drain of transistor M1 and coupled to the source of transistor M2. Control network 202 also comprises a plurality of auxiliary gate resistors Rga1 and Rga2. Gate resistor Rga1 is coupled to a source of an auxiliary gate voltage Vgaux, the junction between gate resistors Rga1 and Rga2 is coupled to the gate of transistor M1a, and gate resistor Rga2 is coupled to the gate of transistor M2a. In an embodiment, the Vg and Vgaux signals can be externally generated in a signal generator 304.

FIG. 3b is a timing diagram 350 associated with the schematic diagram of FIG. 3a. When Vg is at negative voltage (during time interval I) RF switch 300 is OFF, and Vgaux is also low. Transistors M1a and M2a, as well as transistors M1 and M2, are in a high ohmic state. Resistor Z1 is in a low ohmic state and shorts the gate of transistor M3, which has a voltage of v1, to the source of transistor M2, which has a voltage of v2. Voltages v1 and v2 are at DC ground. Transistor M3 is in a high ohmic state because its drain and source are at a negative potential.

When voltage Vg switches to a positive voltage during the transition from OFF to ON states of RF switch 300 (during the initial portion of time interval II) voltage Vgaux follows Vg. Transistors M1a and M1b become low ohmic, effectively shunting resistors Rds1 and Rds2. This allows faster charging of the parasitic capacitances $Cgd_{M1}$, $Cgs_{M2}$, $Cgd_{M2}$ because the source and the drain of transistor M2 become more low ohmic. Resistor Z1 becomes low ohmic only in the direction from voltage v1 to v2 (current can flow from v1 to v2). The resistance in the direction from voltage v2 to v1 is not important in the embodiment of FIG. 3a. Thus, resistor R1 is a component that is low ohmic in one direction, and can be either low ohmic or high ohmic in the other direction. The gates of transistors M1 and M2 are charged to a high potential by voltage Vg. The source of transistor M2 (at voltage v2) remains at ground. The gate of transistor M3 (at voltage v1) remains at ground as well, because resistor Z1 shorts the voltages v1 and v2. Transistor M3 becomes low ohmic, effectively shunting the resistor Rg2 and allowing faster charging of parasitic capacitances $Cgs_{M2}$, $Cgd_{M2}$.

When Vg is at positive voltage (during time interval II) RF switch 300 is ON and voltage Vgaux is also high. Transistors M1a and M2a are low ohmic, as well as transistors M1 and M2. Resistor Z1 is in a low ohmic state. The gate of transistor M3 is at DC ground and transistor M3 is in a low ohmic state.

Voltage Vg switches to a negative voltage during the transition from the ON to OFF states of RF switch 300 (during the initial portion of time interval III). Voltage Vgaux stays at high voltage for the duration of $t_{delay}$ during time interval III. Transistors M1a and M2a stay low ohmic for the duration of $t_{delay}$, and shunt the resistors Rds1 and Rds2, allowing faster discharge of parasitic capacitances $Cgd_{M1}$, $Cgs_{M2}$, $Cgd_{M2}$. Resistor Z1 becomes high ohmic in the direction from voltage v2 to v1 (the current cannot flow from v2 to v1) for the duration of $t_{delay}$. The resistance in the direction from v1 to v2 is not important in the embodiment of FIG. 3b, and so it can be either low ohmic or high ohmic. The gate of transistor M3 decreases to a lower voltage by the same amount as the gates of transistors M1 and M2 because of the capacitive coupling between the gate of transistor M3 and the gates of transistors M1 and M2. The gate of transistor M3 stays at a lower voltage because the current cannot flow in the direction from voltage v2 to v1. In this way, transistor M3 remains low ohmic for the duration of $t_{delay}$ and effectively shunts resistor Rg2. This allows faster discharging of parasitic capacitances $Cgs_{M2}$ and $Cgd_{M2}$.

After the time $t_{delay}$, transistors M1a, M2a, M3 become high ohmic as in the beginning of FIG. 3b (time interval I).

The topology of embodiment RF switch 300 improves switching time since transistors M1a, M2a and M3 shunt resistors Rds1, Rds2, and Rg during switching of the switch from a high ohmic state to a low ohmic state and vice versa, allowing a faster charging and discharging of the gate capacitances of transistors M1 and M2. The shunting is achieved by conserving the gate charge of transistor M3 (which sustains the conductive channel for the PMOS transistor M3) for a short time after the ON towards OFF transition of the RF switch 300 control state.

In an embodiment, transistors M1a and M2a are made smaller (having lower value parasitic capacitances) than transistors M1 and M2 and resistors Rga1 and Rga2 are made smaller than resistors R1 and R2 in order to accelerate the shunting of resistors Rds1 and Rds2 during switching. This sizing will improve the switching time, but will also reduce the RC constants (resistors Rg2, Rds1, and Rds2, coupled to the Cgs and Cgd parasitic capacitors) associated with transistors M1a and M2a. It is desirable to have the RC time constant of transistors M1a and M2a be comparable to the RC constant of transistors M1 and M2 so that additional transistors M1a and M2a do not affect the distribution of the RF voltage across switch 300 when it is in the isolation mode.

One approach to reduce the influence of transistors M1a and M2a on the RF voltage distribution of the RF switch is to connect the gates of transistors M1a and M2a to the gates of transistors M1 and M2. With such an approach the RF voltage distribution will be defined by the RC constant of parallel connected transistors M1 and M1a and parallel connected transistors M2 and M2a. The total gate capacitance will increase (Cg1∥Cg1a, Cg2∥Cg2a), increasing the RC constant. However the total gate resistance will decrease (Rg1∥Rga1, Rg2∥Rga2). The decreased total gate resistance can be compensated by increasing resistances Rg1 and Rg2 because, due to the switching time acceleration described herein, the Rg1 and Rg2 are less of a limiting factor for the switching time. Increased resistances Rga1 and Rga2 are also less of a limiting factor for switching time because transistors M1a and M2a can be made small (less parasitic capacitance) and their gates can be charged quickly even with a large value for Rga1 and Rga2.

Figure 4B:
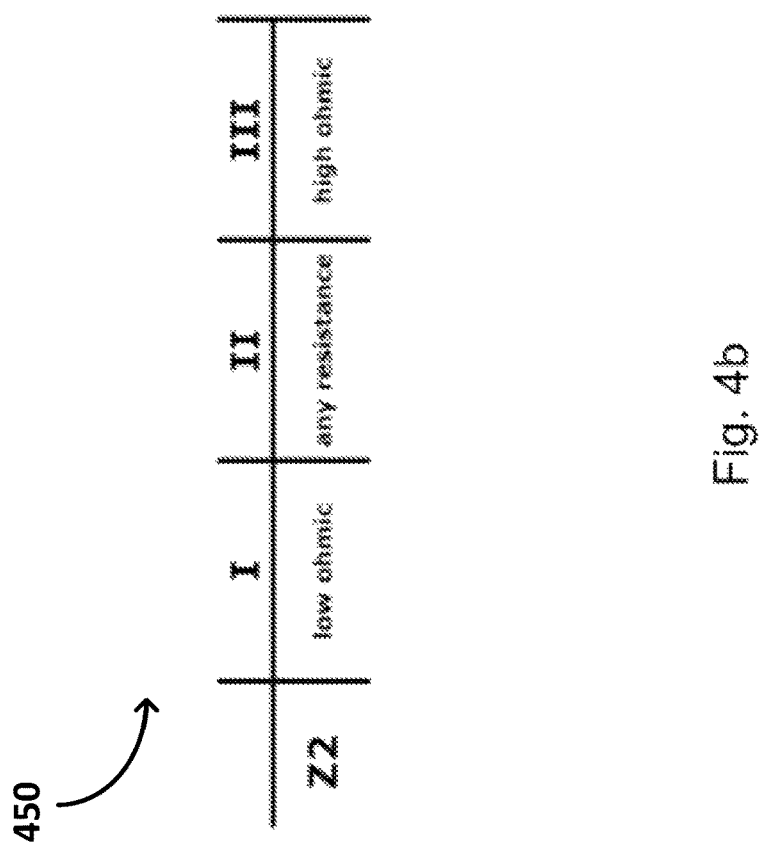
Figure 4A:
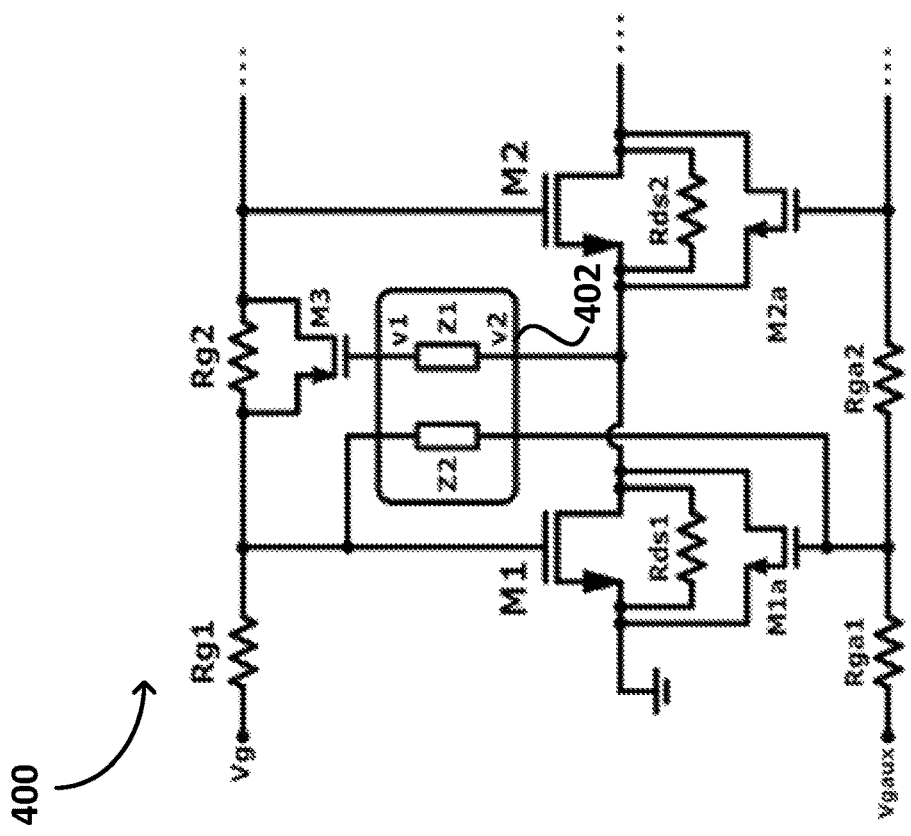
FIG. 4a is a more detailed schematic diagram of the RF switch of FIG. 2, including first and second variable resistors, according to an embodiment.

An implementation of the approach described above with respect to the RF switch 300 of FIG. 3a is shown in the RF switch 400 embodiment of FIG. 4a. RF switch 400 includes all of the components of RF switch 300 shown in FIG. 3a, but also includes a second resistor Z2, which can comprise a variable resistor in an embodiment. The first resistor Z1 and the second resistor Z2 can be implemented by a variable resistor circuit 402 that will be described in further detail below. The boundaries of the control network 202 are not shown in FIG. 4a for clarity, but in the embodiment of FIG. 4a control network 202 comprises resistors Rga1, Rga2, and variable resistor circuit 402. The gate of transistor M1a is coupled to the gate of transistor M1 with variable resistor Z2. (Another such variable resistor is coupled between the gates of transistors M2a and M2 but is not shown for the sake of clarity). In an embodiment, resistors Z1 and Z2 can be part of a variable resistor circuit 402, which can include an NMOS/PMOS transistor implementation.

The value of resistor Z2 is shown in the timing diagram 450 of FIG. 4b for each region (time interval) marked in the timing diagram 350 of FIG. 3b. When RF switch 400 is in the high ohmic state (region I), resistor Z2 is in a low ohmic state and shorts the gates of transistors M1 and M1a together. In region II the resistance of resistor Z2 of the embodiment of FIG. 4a is not important because switch 400 is in a low ohmic state. In region III resistor Z2 is in a high ohmic state because during that time the gates of transistors M1a and M1 are at different potentials (see for example region III of timing diagram 350 of FIG. 3b). In an embodiment, gate control voltages Vgaux and Vg use the same voltage levels.

Figure 5:
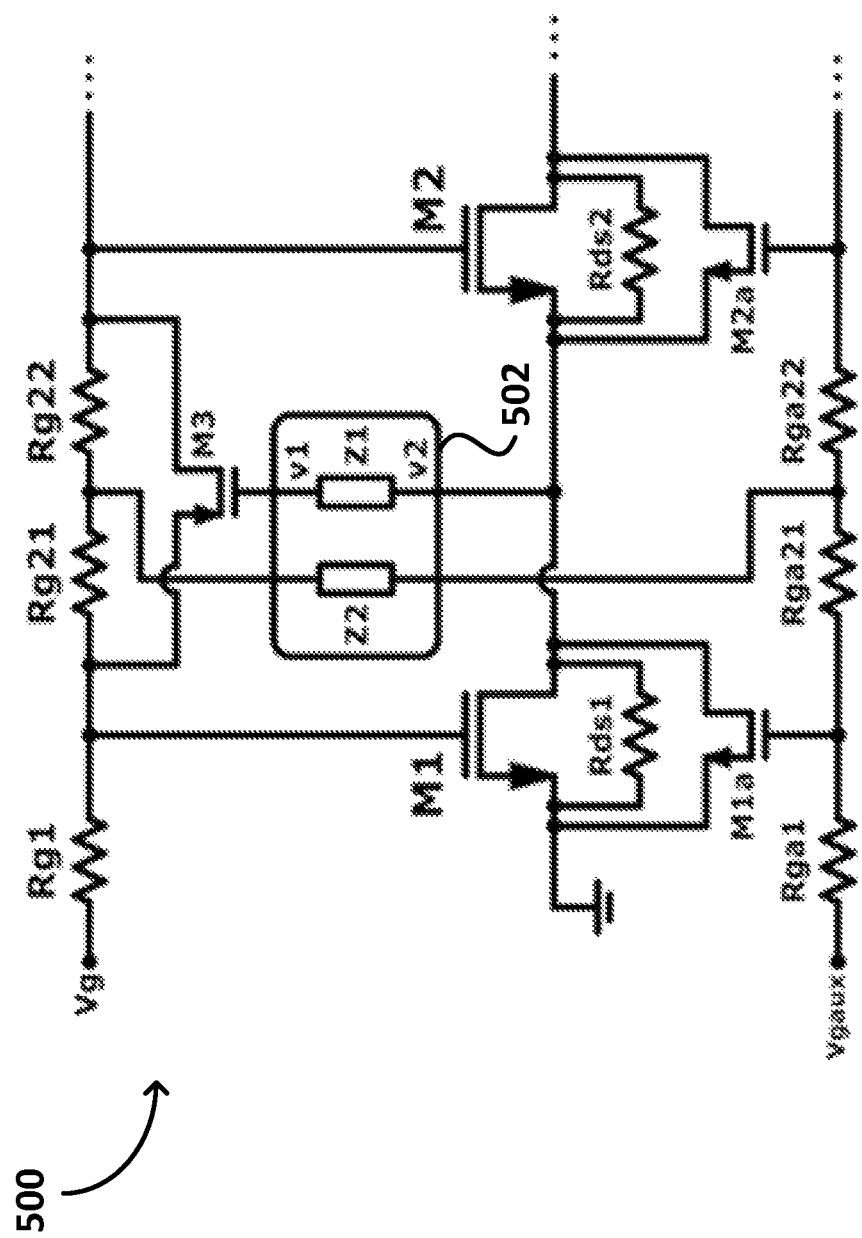
FIG. 5 is a more detailed schematic diagram of the RF switch of FIG. 2, including first and second variable resistors, as well as a split gate bias resistor, according to an embodiment.

FIG. 5 is a detailed schematic diagram of an RF switch 500 that includes a split gate resistor embodiment, which shifts the location of resistor Z2 from a location coupling the junctions between the gate resistors and the auxiliary gate resistors, to a location coupling a center tap of the gate resistors and a center tap of the auxiliary gate resistors. For example, gate resistor Rg2 is split into two resistors Rg21 and Rg22, wherein a first end of resistor Z2 is coupled to the junction between gate resistor Rg21 and gate resistor Rg22. In an embodiment, the total resistance of Rg21 and Rg22 is equal to the resistance of gate resistor Rg2. While gate resistor Rg1 can be similarly split, it is not shown to be split in FIG. 5 for the sake of clarity. In the same manner as splitting resistor Rg2 into resistors Rg21 and Rg22, auxiliary gate resistor Rga2 is split into resistors Rga21 and Rga22 as shown in FIG. 5. A second end of resistor Z2 is coupled to the junction between auxiliary gate resistor Rga21 and auxiliary gate resistor Rga22. In an embodiment, the total resistance of Rga21 and Rga22 is equal to the resistance of auxiliary gate resistor Rga2. While auxiliary gate resistor Rga1 can be similarly split, it is not shown to be split in FIG. 5 for the sake of clarity. Coupling the common nodes of the split gate resistors with resistor Z2 will have a similar effect as coupling the gates of transistors M1a, M2a and transistors M1, M2 because those nodes have the same DC potential. The control timing diagram for resistor Z2 in FIG. 5 is the same or similar to the timing diagram shown in FIG. 4b, previously described. In an embodiment, resistors Z1 and Z2 can be part of a variable resistor circuit 502, which can include an NMOS/PMOS transistor implementation.

Gate resistors Rg1 and Rg2 comprise a control branch of RF switch 400 shown in FIG. 4a, and gate resistors Rga1 and Rg2a comprise an auxiliary control branch of RF switch 400. Similarly, gate resistors Rg1, Rg21, and Rg22 comprise a control branch of RF switch 500 shown in FIG. 5, and gate resistors Rga1, Rga21, and Rga22 comprise an auxiliary control branch of RF switch 500. In addition to shorting the auxiliary control branch to the main control branch as is shown in FIG. 4a and FIG. 5, additional control branches can be introduced into an RF switch 600 as is shown FIG. 6a, according to an embodiment. The additional control branches can be used to control resistors Z1 and Z2 or in other ways to improve the operation of the RF switch.

In FIG. 6 two additional control branches are shown. A first additional control branch includes resistors Ri1, Ri21, and Ri22, wherein resistor Ri1 is coupled to a source of control voltage V1. The first additional control branch is coupled to the main control branch with a variable resistor Z1. Resistor Z1 has a first end coupled to the junction of resistor Ri21 and resistor Ri22, and a second end coupled to the junction of resistor Rg21 and resistor Rg22. A second additional control branch includes resistor Rk21 and resistor Rk22, wherein resistor Rk21 is coupled to a source of control voltage Vk. The second additional control branch is coupled to transistor M1 and transistor M2 of RF switch 600 with a variable resistor Zk. Resistor Zk has a first end coupled to the junction of transistor M1 and transistor M2 (which has a voltage of Vs), and a second end coupled to the junction of resistor Rk21 and resistor Rk22.

In an embodiment, resistors Z1 and Z2 can be part of a variable resistor circuit 602, which can include an NMOS/PMOS transistor implementation. In other embodiments, variable resistor circuit 602 can also include resistor Z1, Zk, or both, which can also include an NMOS/PMOS transistor implementation.

A timing diagram 650 of the resistances of resistor Z1 and resistor Zk is shown in FIG. 6b. Regions I, II, and III are the regions (time intervals) shown in FIG. 3b. In region I resistor Z1 and resistor Zk are in a low ohmic state. Control voltage V1 is resistively coupled to control voltage Vg through resistor Z1, and control voltage Vk is resistively coupled to voltage Vs through resistor Zk, in an embodiment. Control voltage V1 is set to the same DC potential as control voltage Vg, and control voltage Vk is set to the same DC potential as control voltage Vs to avoid cross currents between the shorted branches. In regions II and III resistor Z1 is high ohmic only when control voltage V1 is not at the same potential as control voltage Vg. Otherwise (when control voltage V1 is at the same potential as control voltage Vg), the resistance of resistor Z1 is not important in the embodiment of RF switch 600. Resistor Zk is high ohmic only when control voltage Vk is not at the same potential as voltage Vs. Otherwise (when control voltage Vk is at the same potential as voltage Vs) the resistance of resistor Zk is not important in the embodiment of RF switch 600.

A detailed schematic of an RF switch 700 is shown in FIG. 7a, which is a transistor-level implementation of RF switch 500 shown on FIG. 5, according to an embodiment. Transistors M1, M2, M3, M1a, and M2 are shown and have been previously described. Resistors Rg1, Rg2, Rg22, Rga1, Rga2i, Rga22, Rds1, and Rds2 are shown and have also been previously described. Control voltages Vg and Vgaux are shown and have also been previously described. Variable resistors Z1 and Z2, however, are implemented by an NMOS/PMOS transistor circuit comprising PMOS transistor M4, NMOS transistor M5, and diode D1. The source of transistor M4 is coupled to the junction between transistors M1 and M2 (voltage Vs), and the source of transistor M5 is coupled to the junction between resistors Rg21 and Rg22. Diode D1 has an anode coupled to the drain of transistor M4 and a cathode coupled to the source of transistor M2a. The drain of transistor M4 is coupled to the gate of transistor M5 (voltage V1), which in turn is coupled to the gate of transistor M3. The gate of transistor M4 is coupled to the drain of transistor M5.

FIG. 7b is a timing diagram 750 associated with the schematic diagram of embodiment RF switch 700 of FIG. 7a. The control voltage Vgaux is controlled as is shown in the timing diagram 750 of FIG. 7b. The behavior of the gate of transistor M3 (voltage v1) is also shown in the timing diagram 750 of FIG. 7b. In region I control voltages Vg and Vgaux are both at a negative potential with respect to ground. Transistors M4 and M5 are latched to the low ohmic state. Voltage v1 is tied to voltage Vs by transistor M4, while the main control branch (Rg1, Rg21, Rg22) and the auxiliary control branch (Rga1, Rga21, Rga22) are tied together by transistor M5. Transistor M3 is in a high ohmic state because the gate is at higher potential than the source. Transistors M1a and M2a are in a high ohmic state because their sources are at higher potential than the gates.

During the transition from region I to region II voltage v1 follows control voltage Vg due to capacitive coupling through the gate capacitance of transistor M3, but is limited by the action of diode D1. As can be seen in FIG. 7b, voltage v1 slowly discharges to ground because of the leakage of the diode D1. Transistor M3 is in a low ohmic state because its drain and source are at higher potential than the gate.

In region II control voltages Vg and Vgaux are both at positive potential. Transistors M4 and M5 are latched to the high ohmic state. Transistors M1a and M2a are in the low ohmic state because their gate voltages are at a higher potential than the corresponding drain and source voltages.

During the transition from region II to region III voltage v1 drops to the negative potential by the same amount as Vg due to capacitive coupling from control voltage Vg to voltage v1 through the gate capacitance of transistor M3.

In region III control voltage Vg is at negative potential and control voltage Vgaux is at positive potential. Transistor M4 is at a high ohmic state because its gate is positive. Transistor M5 remains in the high ohmic state as in region II, because its gate drops to the negative potential by the same amount as its source. The drain of transistor M5 is at positive potential. Transistors M1a and M2a are in a low ohmic state because their gate voltages are at higher potential than the corresponding drain and source voltages. Transistor M3 remains in the low ohmic state as in the region II because its gate decreased by the same amount as its source and drain.

During the transition from region III to region I control voltage Vgaux falls to a negative potential, and transistor M4 transitions to a low ohmic state. Transistor M4 ties voltage v1 to voltage Vs. The increase in voltage v1 makes transistor M5 low ohmic. Transistor M5 ties the main control branch and the auxiliary control branch together.

Figure 8A:
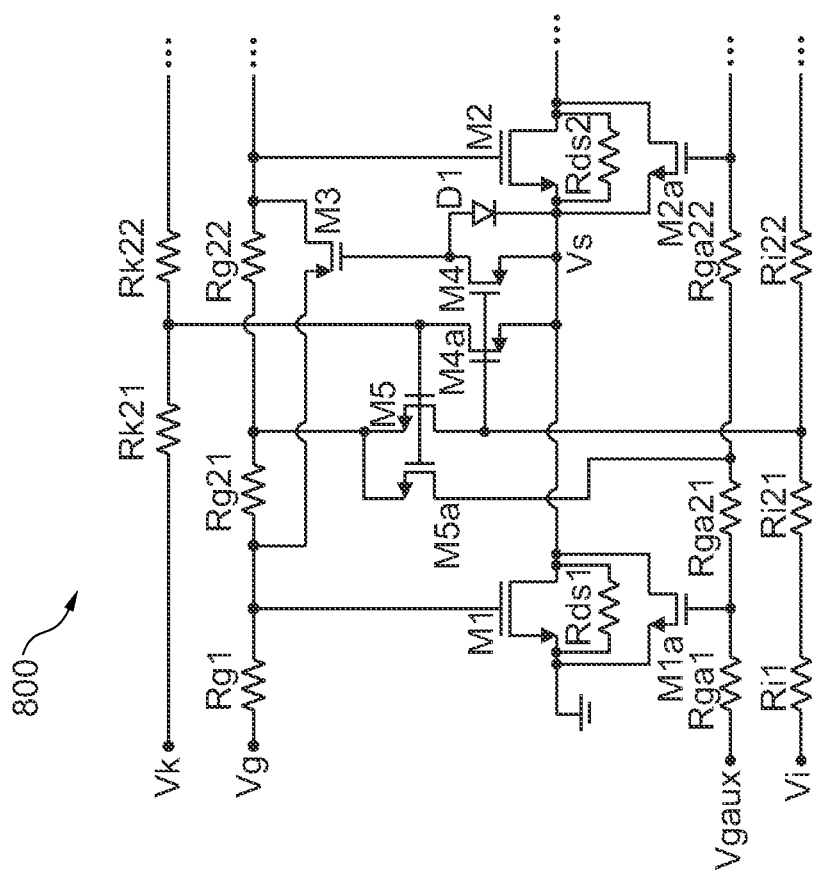
FIG. 8a is a more detailed schematic diagram of the RF switch of FIG. 2, wherein the first and second variable resistors are implemented as portions of an NMOS/PMOS variable resistor circuit coupled to first and second control branches, according to an embodiment.

Another embodiment RF switch (RF switch 800) with additional control branches (as was previously shown in RF switch of FIG. 6a) is shown in the schematic diagram of FIG. 8a. All of the components shown in FIG. 8a have been previously shown and described with respect to FIG. 6a, such as the main RF switch path including transistors M1 and M2, drain to source resistors Rds1 and Rds2, and gate resistors Rg1, Rg21, and Rg22 for receiving control voltage Vg. RF switch 800 includes acceleration transistors M1a, M2a, and M3, all previously described. RF switch 800 also includes an auxiliary control branch including resistors Rga1, Rga21, and Rga22 for receiving control voltage Vgaux. RF switch 800 also includes a first additional control branch including resistors Ri1, Ri21, and Ri22 for receiving control voltage V1, and a second additional control branch including resistors Rk21 and Rk22 for receiving control voltage Vk. The additional branches control the gate of transistor M3 and couple the gate resistors to the auxiliary gate resistors when the main RF switch path is in the high ohmic state. In addition, the second control branch is shorted to the Vs node with transistor M4a, and the first control branch is shorted to the gate resistors with transistor M5.

In FIG. 8a, variable resistors Z1, Z2, Zl, and Zk are all implemented by an embodiment NMOS/PMOS transistor circuit including NMOS transistors M5a and M5, PMOS transistors M4a and M4, and diode D1. The sources of transistors M5a and M5 are coupled to the junction between resistors Rg21 and Rg22, and the sources of transistors M4a and M4 are coupled to the Vs node. The gates of transistors M5a and M5 are coupled together and to the drain of transistor M4a. The gates of transistors M4a and M4 are coupled together and to the drain of transistor M5. The drain of transistor M5 is coupled to the junction of resistors Rga2i and Rga22. The drain of transistor M4 is coupled to the gate of transistor M3 and to the anode of diode D1. The cathode of diode D1 is coupled to the Vs node.

Figure 8B:
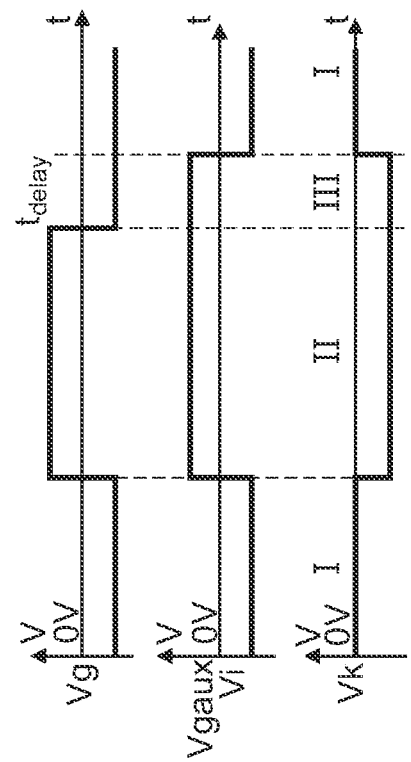

The control signals for the circuit on FIG. 8a are shown in timing diagram 850 of FIG. 8b. During time interval I control voltages Vg, Vgaux, and V1 are at a negative potential, and control voltage Vk is at ground potential. During time interval II control voltages Vg, Vgaux, and V1 are at a positive potential, and control voltage Vk is at a negative potential. During time interval III (also labeled $t_{delay}$) control voltages Vg and Vk are at a negative potential and control voltages Vgaux and V1 are at a positive potential. The control voltages then return to the initial potentials during the subsequent time interval I as shown in the example timing diagram 850 of FIG. 8b.

FIG. 9a is a schematic diagram of RF switch 900 that includes only a single additional control branch, which also provides switching acceleration according to an embodiment. The main signal path of RF switch 900 includes transistors M1 and M2, source-drain resistors Rds1 and Rds2, and a main control branch including gate resistors Rg1, Rg2i, and Rg22, previously discussed. RF switch 900 also includes acceleration transistors M1a, M2a, and M3, also previously discussed. The single additional control branch includes resistors Rk2i and Rk22 for receiving control voltage Vk. Variable resistors Z1 and Z2 are implemented in an NMOS/PMOS transistor circuit comprising PMOS transistors M4, M6, and M7, NMOS transistors M5 and M8, as well as diode D1. The sources of transistors M8 and M5 are coupled to the junction between resistors Rg21 and Rg22. The source of transistor M4, the drain of transistor M7, and the cathode of diode D1 are coupled to the Vs node. The gates of transistors M5, M6, and M8 are also coupled to the junction between resistors Rk21 and Rk22. The gates of transistors M4 and M7 are coupled together, and the drain of transistor M7 is coupled to the source of transistor M4. In operation, the gate of transistor M4 is controlled by the drain-coupled transistors M5 and M6, which form an inverting stage. Transistor M7 is used to resistively couple the Vk to Vs voltages together (through resistor Rk2i). Transistor M8 resistively couples the Vgaux and Vg voltages together (through the gate and auxiliary gate resistors).

The control signals for the RF switch 900 of FIG. 9a are shown in timing diagram 950 of FIG. 9b. During time interval I control voltages Vg and Vgaux are at a negative potential, and control voltage Vk is at ground potential. During time interval II control voltages Vg and Vgaux are at a positive potential, and control voltage Vk is at a negative potential. During time interval III (also labeled $t_{delay}$) control voltages Vg and Vk are at a negative potential and control voltage Vgaux is at a positive potential. The control voltages then return to the initial potentials during the subsequent time interval I as shown in the example timing diagram 950 of FIG. 9b.

Figures 10A, 10B:
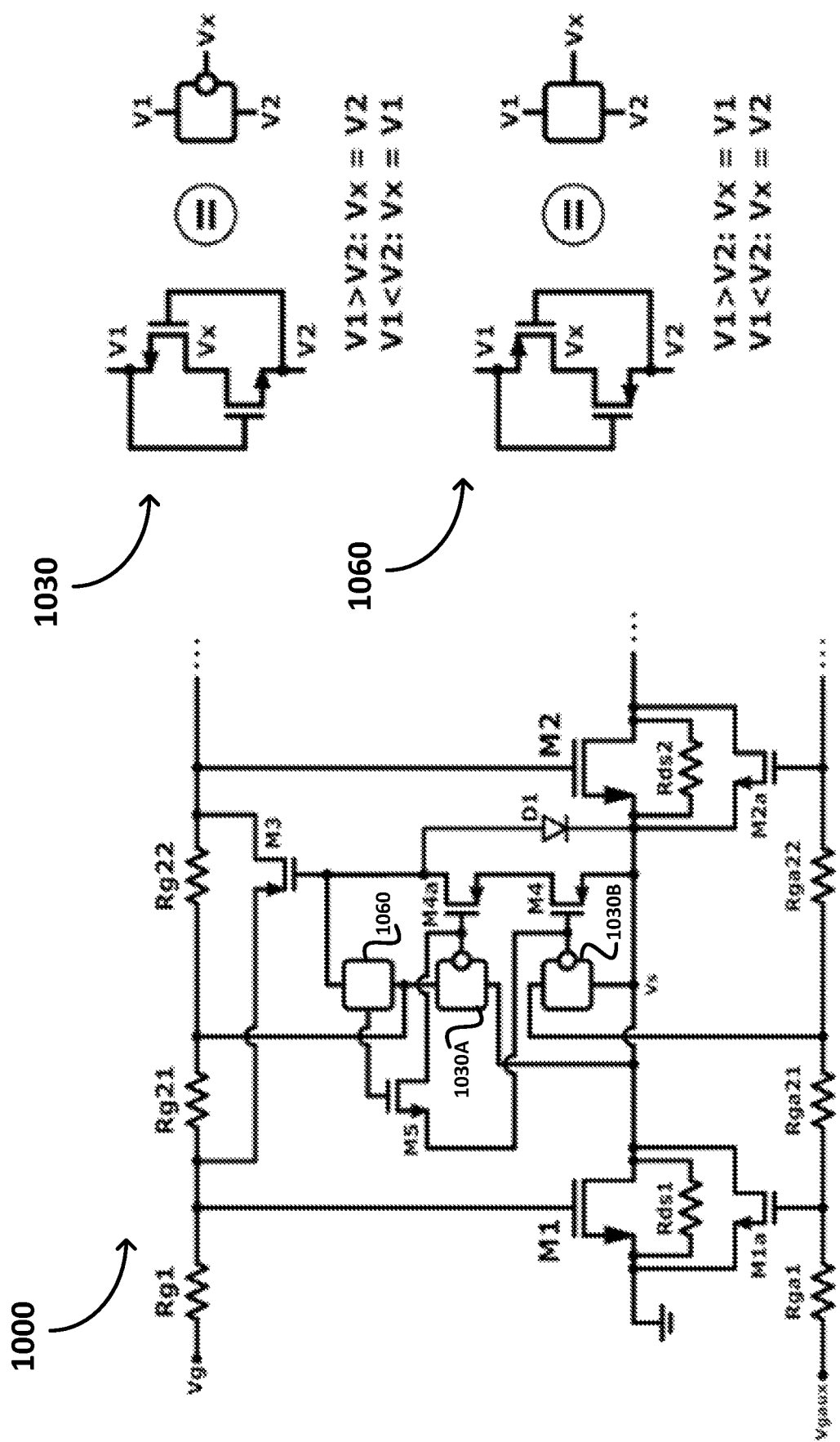
FIG. 10a is a more detailed schematic diagram of the RF switch of FIG. 2, including a plurality of variable resistor circuits, according to an embodiment.
FIG. 10b are schematic diagrams of the variable resistor circuits of FIG. 10a, according to an embodiment.

FIG. 10a is a schematic diagram of an RF switch 1000 with switching time acceleration advantages as previously described, but being well suited for fabrication in low voltage semiconductor processes. For example, RF switch 700 shown in FIG. 7a may experience voltage swings in excess of five volts. In region III the gate-drain voltage of transistor M4 and the drain-source voltage of transistor M5 is equal to the full range of Vg (assuming the same voltage levels for Vg and Vgaux). The Vg control voltage typically switches between approximately ±3V. The voltage drop across transistors M4 and M5 therefore can be up to 9V, which may be excessive for some lower voltage semiconductor process technologies. A low voltage embodiment (RF switch 1000) suitable for fabrication in lower voltage semiconductor process technologies is thus shown in FIG. 10a.

In RF switch 1000 none of the transistors, including the transistors in certain circuit elements described below, are subjected to a voltage more than one positive Vg voltage or one negative Vg voltage. RF switch 1000 comprises gate resistors, auxiliary gate resistors, a main signal switch path, and acceleration transistors all previously shown and described. The variable resistors Z1 and Z2, also previously shown and described, are implemented with a low voltage NMOS/PMOS transistor circuit that is described in further detail below. In particular, RF switch 1000 comprises instances of circuit element 1030 and circuit element 1060, as well as other components. Further details of circuit elements 1030 and 1060 are described below and shown in FIG. 10*b*.

The NMOS/PMOS transistor circuit comprises PMOS transistor M4, PMOS transistor M4*a*, NMOS transistor M5, diode D1, circuit element 1030A, circuit element 1030B, and circuit element 1060. The drain of transistor M4*a* is coupled to the gate of transistor M3, the source of transistor M4 is coupled to the Vs node, the drain of transistor M4 is coupled to the source of transistor M4*a*. A first node of circuit element 1060 is coupled to the gate of transistor M3, and a second node of circuit element 1060 is coupled to the junction between gate resistors Rg2*i* and Rg22. A third node of circuit element 1060 is coupled to the gate of transistor M5. A first node of circuit element 1030A is coupled to the second node of circuit element 1060. A second node of circuit element 1030A is coupled to the Vs node. A third node of circuit element 1030A is coupled to the gate of transistor M4*a*. A first node of circuit element 1030B is coupled to the junction between resistors Rga2*i* and Rga22, and a second node of circuit element 1030B is coupled to the Vs node. A third node of circuit element 1030B is coupled to the gate of transistor M4. The drain of transistor M5 is coupled to the gate of transistor M4*a*, and the source of transistor M5 is coupled to the gate of transistor M4. The anode of diode D1 is coupled to the drain of transistor M4*a*, and the cathode of diode D1 is coupled to the source of transistor M2*a*.

Turning now to FIG. 10*b*, circuit element 1030 comprises NMOS devices, and ties a voltage Vx (third node) to the lower of two voltages V1 (first node) and V2 (second node). Both the transistor diagram (left) and the circuit element symbol (right) of circuit element 1030 are shown in FIG. 10*b*. In operation if V1>V2, then Vx=V2; if V1<V2, then Vx=V1. Circuit element 1060 comprises PMOS devices, and ties the voltage Vx (third node) to the higher of two voltages V1 (first node) and V2 (second node). Both the transistor diagram (left) and the circuit element symbol (right) of circuit element 1060 are shown in FIG. 10*b*. In operation if V1>V2, then Vx=V1; if V1<V2, then Vx=V2.

Figure 11:
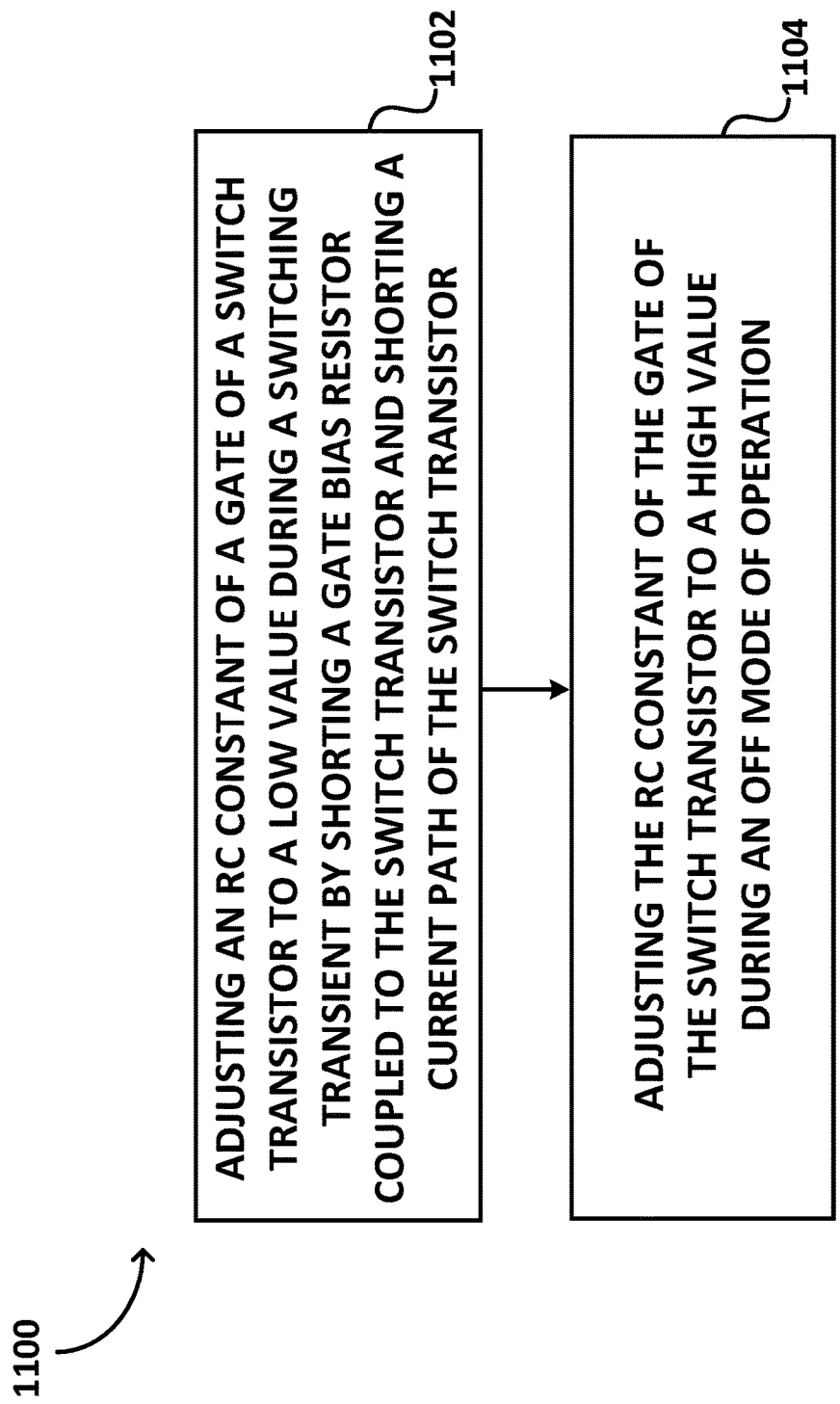
FIG. 11 is a flow chart of an embodiment method.

FIG. 11 is a flow chart of a method 1100 of operating an RF switch, according to an embodiment. The method comprises adjusting an resistor-capacitor (RC) constant of a gate of a switch transistor of the RF switch to a low value during a switching transient of the RF switch at step 1102; and adjusting the RC constant of the gate of the switch transistor to a high value during an OFF mode of operation of the RF switch, wherein adjusting the RC constant of the gate of the switch transistor to a low value comprises shorting a gate bias resistor coupled to the switch transistor and shorting a current path of the switch transistor during the switching transient at step 1104.

Embodiments of an RF switch with switching time acceleration have been shown and described, and are summarized below.

According to an embodiment, a radio frequency (RF) switch 200, shown in FIG. 2 comprises a switchable RF path comprising a plurality of transistors (M1, M2) coupled in series; a gate bias network comprising a plurality of resistors (Rg1, Rg2), wherein the gate bias network is coupled to each of the plurality of transistors (M1, M2) in the switchable RF path; and a bypass network comprising a first plurality of transistors (M1*a*, M2*a*) coupled in parallel to each of the plurality of transistors (M1, M2) in the switchable RF path and a second plurality of transistors (M3) coupled in parallel to each of the plurality of resistors (Rg1, Rg2) in the gate bias network. In other words, each of the transistors in the switchable RF path is coupled in parallel to a corresponding time acceleration transistor, and each of the resistors in the gate bias network is coupled in parallel to a corresponding time acceleration transistor.

According to an embodiment, a radio frequency (RF) switch cell 300, shown in FIG. 3 comprises a first transistor (M1) having a current path and a control node; a first biasing resistor (Rg2) coupled to the control node of the first transistor (M1), wherein the first biasing resistor (Rg2) is configured for receiving a first control signal (Vg); a second transistor (M1*a*) having a current path and a control node, wherein the current path of the second transistor (M1*a*) is in parallel with the current path of the first transistor (M1); a second biasing resistor (Rga2) coupled to the control node of the second transistor (M1*a*), wherein the second biasing resistor (Rga2) is configured for receiving a second control signal (Vgaux); a third transistor (M3) having a control path and a control node, wherein the current path of the third transistor (M3) is coupled across the first biasing resistor (Rg2); and a first variable resistor (Z1) coupled between a control node of the third transistor (M3) and the current path of the first transistor (M1).

According to an embodiment, a method of operating a radio frequency (RF) switch 200, shown in FIG. 2, includes adjusting an resistor-capacitor (RC) constant of a gate of a switch transistor (M1) of the RF switch 200 to a low value during a switching transient of the RF switch; and adjusting the RC constant of the gate of the switch transistor (M1) to a high value during an OFF mode of operation of the RF switch, wherein adjusting the RC constant of the gate of the switch transistor to a low value comprises shorting a gate bias resistor (Rg2) coupled to the switch transistor (M1) and shorting a current path of the switch transistor (M1) during the switching transient.

Example embodiments of the present invention are summarized here. Other embodiments can also be understood from the entirety of the specification and the claims filed herein.

Example 1. According to an embodiment, a radio frequency (RF) switch includes a switchable RF path including a plurality of transistors coupled in series; a gate bias network including a plurality of resistors, wherein the gate bias network is coupled to each of the plurality of transistors in the switchable RF path; and a bypass network including a first plurality of transistors coupled in parallel to each of the plurality of transistors in the switchable RF path and a second plurality of transistors coupled in parallel to each of the plurality of resistors in the gate bias network.

Example 2. The RF switch of Example 1, wherein the bypass network is configured to bypass the switchable RF path and to bypass the gate bias network during a switching transient of the RF switch.

Example 3. The RF switch of any of the above examples, wherein each transistor in the second plurality of transistors is coupled to a first variable resistor, and wherein the first variable resistor is configured to switch between a low impedance value and a high impedance value during the switching transient of the RF switch.

Example 4. The RF switch of any of the above examples, wherein the first variable resistor includes at least a portion of a PMOS/NMOS transistor circuit.

Example 5. The RF switch of any of the above examples, wherein each resistor in the gate bias network is coupled to a second variable resistor, and wherein the second variable resistor is configured to switch between a low impedance value and a high impedance value during the switching transient of the RF switch.

Example 6. The RF switch of any of the above examples, wherein the second variable resistor includes at least a portion of a PMOS/NMOS transistor circuit.

Example 7. The RF switch of any of the above examples, further including a first control branch coupled to the switchable RF path; and a second control branch coupled to the gate bias network.

Example 8. The RF switch of any of the above examples, wherein the first control branch is coupled to the switchable RF path through at least one third variable resistor, and wherein the second control branch is coupled to the gate bias network through at least one fourth variable resistor.

Example 9. According to an embodiment, a radio frequency switch cell includes a first transistor having a current path and a control node; a first biasing resistor coupled to the control node of the first transistor, wherein the first biasing resistor is configured for receiving a first control signal; a second transistor having a current path and a control node, wherein the current path of the second transistor is in parallel with the current path of the first transistor; a second biasing resistor coupled to the control node of the second transistor, wherein the second biasing resistor is configured for receiving a second control signal; a third transistor having a control path and a control node, wherein the current path of the third transistor is coupled across the first biasing resistor; and a first variable resistor coupled between a control node of the third transistor and the current path of the first transistor.

Example 10. The RF switch cell of Example 9, wherein an impedance value of the first variable resistor is determined by a voltage value of the first control signal and a voltage value of the second control signal.

Example 11. The RF switch cell of any of the above examples, further including a second variable resistor coupled between the first biasing resistor and the second biasing resistor.

Example 12. The RF switch cell of any of the above examples, wherein an impedance value of the second variable resistor is determined by a difference between a voltage value of the first control signal and a voltage value of the second control signal.

Example 13. According to an embodiment, a method of operating a radio frequency (RF) switch includes adjusting an resistor-capacitor (RC) constant of a gate of a switch transistor of the RF switch to a low value during a switching transient of the RF switch; and adjusting the RC constant of the gate of the switch transistor to a high value during an OFF mode of operation of the RF switch, wherein adjusting the RC constant of the gate of the switch transistor to a low value includes shorting a gate bias resistor coupled to the switch transistor and shorting a current path of the switch transistor during the switching transient.

Example 14. The method of example 13, wherein shorting the gate bias resistor is performed with a first shorting transistor.

Example 15. The method of any of the above examples, further including conserving gate charge of the first shorting transistor for a delay interval after the RF switch receives a state-change command.

Example 16. The method of any of the above examples, further including clamping a gate of the first shorting transistor to the current path of the switch transistor.

Example 17. The method of any of the above examples, wherein clamping the gate of the first shorting transistor to the current path of the switch transistor includes coupling the gate of the first shorting transistor to the current path of the switch transistor through a first variable resistor.

Example 18. The method of any of the above examples, wherein shorting the current path of the switch transistor is performed with a second shorting transistor.

Example 19. The method of any of the above examples, further including clamping a gate of the second shorting transistor to the gate bias resistor.

Example 20. The method of any of the above examples, wherein clamping the gate of the second shorting transistor to the gate bias resistor includes coupling the gate of the second shorting transistor to the gate bias resistor through a second variable resistor.

Embodiments of an RF switch having acceleration transistors and components have been shown and described herein. While only two RF switch cells, and one set of acceleration transistors and components are shown in some drawing figures for the sake of clarity, it will be appreciated by those skilled in the art that any number of RF switch cells, and a corresponding number of sets of acceleration transistors and components can be used. In some high voltage RF switch embodiments as many as 50 or more RF switch cells can be used in a stacked configuration.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A radio frequency (RF) switch comprising:
   a switchable RF path comprising a plurality of transistors coupled in series;
   a gate bias network comprising a plurality of resistors, wherein the gate bias network is coupled to each of the plurality of transistors in the switchable RF path; and
   a bypass network comprising a plurality of transistors coupled in parallel with each of the plurality of transistors in the switchable RF path and at least one additional transistor coupled in parallel with at least one resistor in the gate bias network,
   wherein the at least one additional transistor is coupled to a first variable resistor, and wherein the first variable resistor comprises at least one PMOS transistor coupled to at least one NMOS transistor.

2. The RF switch of claim 1, wherein the bypass network is configured to bypass the switchable RF path and to bypass the gate bias network during a switching transition of the RF switch.

3. The RF switch of claim 2, wherein the first variable resistor is configured to switch between a low impedance value and a high impedance value during the switching transition of the RF switch.

4. The RF switch of claim 3, wherein the first variable resistor comprises at least a portion of a transistor and diode circuit including the at least one PMOS transistor and the at least one NMOS transistor.

5. The RF switch of claim 3, wherein each resistor in the gate bias network is coupled to a second variable resistor, and wherein the second variable resistor is configured to switch between a low impedance value and a high impedance value during the switching transition of the RF switch.

6. The RF switch of claim 5, wherein the second variable resistor comprises at least a portion of a transistor and diode circuit including the at least one PMOS transistor and the at least one NMOS transistor.

7. The RF switch of claim 1, further comprising:
a first control branch coupled to the switchable RF path; and
a second control branch coupled to the gate bias network.

8. The RF switch of claim 7, wherein the first control branch is coupled to the switchable RF path through at least one third variable resistor, and wherein the second control branch is coupled to the gate bias network through at least one fourth variable resistor.

9. A radio frequency (RF) switch cell comprising:
a first transistor having a current path and a control node;
a first biasing resistor coupled to the control node of the first transistor, wherein the first biasing resistor is configured for receiving a first control signal;
a second transistor having a current path and a control node, wherein the current path of the second transistor is in parallel with the current path of the first transistor;
a second biasing resistor coupled to the control node of the second transistor, wherein the second biasing resistor is configured for receiving a second control signal;
a third transistor having a control path and a control node, wherein the current path of the third transistor is coupled across the first biasing resistor; and
a first variable resistor coupled between the control node of the third transistor and the current path of the first transistor, wherein the first variable resistor comprises at least one PMOS transistor coupled to at least one NMOS transistor.

10. The RF switch cell of claim 9, wherein an impedance value of the first variable resistor is determined by a voltage value of the first control signal and a voltage value of the second control signal.

11. The RF switch cell of claim 9, further comprising a second variable resistor coupled between the first biasing resistor and the second biasing resistor.

12. The RF switch cell of claim 11, wherein an impedance value of the second variable resistor is determined by a voltage value of the first control signal and a voltage value of the second control signal.

13. A method of operating a radio frequency (RF) switch, the method comprising:
adjusting a resistor-capacitor (RC) constant of a gate of a switch transistor of the RF switch to a low value during a switching transition of the RF switch; and
adjusting the RC constant of the gate of the switch transistor to a high value during an OFF mode of operation of the RF switch, wherein adjusting the RC constant of the gate of the switch transistor to a low value comprises shorting a gate bias resistor coupled to the switch transistor and shorting a current path of the switch transistor during the switching transition,
wherein shorting the gate bias resistor is performed with a first shorting transistor, wherein a gate of the first shorting transistor is coupled to a first variable resistor, and wherein the first variable resistor comprises at least one PMOS transistor coupled to at least one NMOS transistor.

14. The method of claim 13, wherein the first variable resistor comprises at least a portion of a transistor and diode circuit including the at least one PMOS transistor and the at least one NMOS transistor.

15. The method of claim 14, further comprising conserving gate charge of the first shorting transistor for a delay interval after the RF switch receives a state-change command.

16. The method of claim 15, further comprising clamping a gate of the first shorting transistor to the current path of the switch transistor.

17. The method of claim 16, wherein clamping the gate of the first shorting transistor to the current path of the switch transistor comprises coupling the gate of the first shorting transistor to the current path of the switch transistor through the first variable resistor.

18. The method of claim 17, wherein shorting the current path of the switch transistor is performed with a second shorting transistor.

19. The method of claim 18, further comprising clamping a gate of the second shorting transistor to the gate bias resistor.

20. The method of claim 19, wherein clamping the gate of the second shorting transistor to the gate bias resistor comprises coupling the gate of the second shorting transistor to the gate bias resistor through a second variable resistor.

* * * * *